United States Patent [19]
Takenaka et al.

[11] Patent Number: 6,077,451
[45] Date of Patent: Jun. 20, 2000

[54] METHOD AND APPARATUS FOR ETCHING OF SILICON MATERIALS

[75] Inventors: Miyuki Takenaka; Yuji Yamada; Masaru Hayashi; Hideki Matsunaga; Akira Okada, all of Kanagawa, Japan

[73] Assignee: Kabushiki Kaisha Toshiba, Kawasaki, Japan

[21] Appl. No.: 08/826,162

[22] Filed: Mar. 27, 1997

[30] Foreign Application Priority Data

Mar. 28, 1996 [JP] Japan ..................................... 8-073400
Sep. 19, 1996 [JP] Japan ..................................... 8-247411

[51] Int. Cl.$^7$ ............................. H01L 21/00; C23F 1/02; B44C 1/22
[52] U.S. Cl. ................................ 216/79; 216/58; 216/59; 156/345; 438/706
[58] Field of Search ................................ 156/345; 216/2, 216/14, 58, 59, 79; 438/8, 14, 706

[56] References Cited

U.S. PATENT DOCUMENTS

| | | | |
|---|---|---|---|
| 3,511,727 | 5/1970 | Hays ......................................... | 156/17 |
| 4,310,380 | 1/1982 | Flamm et al. ........................... | 156/643 |
| 4,498,953 | 2/1985 | Cook et al. .............................. | 156/646 |
| 4,749,440 | 6/1988 | Blackwood et al. .................... | 156/646 |
| 5,288,333 | 2/1994 | Tanaka et al. ............................ | 134/31 |
| 5,395,482 | 3/1995 | Onda et al. .............................. | 156/646 |

OTHER PUBLICATIONS

Ibbotson, D.E. et al, "Plasmaless dry etching of silicon with fluorine–containing compounds", J. Appl. Phys. 56(10) pp. 2939–2942, Nov. 1984.

*Primary Examiner*—Richard Bueker
*Assistant Examiner*—Alva C. Powell
*Attorney, Agent, or Firm*—Foley & Lardner

[57] ABSTRACT

Disclosed is a method and an apparatus for etching a silicon material in order to prepare a sample for measuring the impurities which are contained in the silicon material. The silicon material is etched by contacting the silicon material with an etching gas containing a fluorine compound which is selected from the group consisting of xenon fluoride, hydrogen fluoride, oxygen fluoride and halogen fluoride, to produce a product by reaction of the silicon material with the etching gas. The product is heated to evaporate and remove the product from an impurity which is contained in the silicon material and not reactive to the etching gas.

11 Claims, 4 Drawing Sheets

METHOD AND APPARATUS FOR ETCHING OF SILICON MATERIALS

BACKGROUND OF THE INVENTION

1. Field of the Invention

The present invention relates to an etching method of silicon materials, particularly to an etching method of silicon materials employed for the preparation of analytical samples for the analysis of impurities contained in silicon materials which are used for a semiconductor.

2. Description of the Related Art

A silicon material composed of Si or $SiO_2$ crystals has been used as a semiconductor substrate or the like. When impurities such as sodium, potassium and/or iron are contained in these crystals, even in a trace amount, the electrical properties of the semiconductor device fabricated from them become unstable. Thus, impurities are known to be a large influence on the properties of semiconductor device. Accordingly, it is necessary to suppress the content of impurities in the silicon material as low as possible in order to make high the properties of the semiconductor device. However, as a preliminary step prior to the suppression of the impurity content, precise analysis of the impurity concentration in the silicon material is inevitable.

With a tendency to the miniaturization of a semiconductor substrate in recent years, it has come to be clear that the crystallinity in the vicinity of the surface of a silicon wafer is a very important factor for controlling the properties of the substrate. Described specifically, in the vicinity of the surface of the silicon wafer, that is, about 10 µm deep from the surface (so-called Denuded Zone), micro defects such as oxygen precipitate have an influence upon the electrical properties such as withstand voltage or the like; or metal impurities which have entered from the surface of the wafer and mixed therein during the step such as ion implantation are diffused even to the surface again at the time of subsequent thermal treatment, thereby forming precipitation defects. Such problems caused by metal impurities have been serious. Accordingly, for the purpose of studying the properties in the vicinity of the surface, there is a strong demand for a highly-sensitive detection method of metal impurities which method facilitates the measurement of the concentration as low as 1 ppt to 0.1 ppt.

Frameless atomic absorption photometer, inductively coupled plasma mass spectrometer or the like is generally employed for the measurement of the impurities contained in the silicon materials. For the preparation of a sample solution provided for the frameless atomic absorption photometer, the following methods are conventionally adopted. Specifically, in the first method, a sample solution for frameless atomic absorption analysis is prepared by subjecting a silicon material to direct etching with a mixed solution of hydrofluoric acid and nitric acid, evaporating the solution to dryness to obtain a residue and then adding pure water to the residue to dilute into a fixed volume. In the second method, a sample solution for frameless atomic absorption analysis is prepared by heating a mixed solution of hydrofluoric acid and nitric acid at 100° C. to generate acid vapor, etching the silicon material with the acid vapor and then using it as it is.

It is however very difficult to carry out high purification of the reagents used in the above methods for the analysis of the impurities contained in the silicon material. For example, even the reagents purified by non-boiling distillation method or ion exchange method already contain impurities (e.g. Na, K) in an amount not smaller than 10 ppt. If the silicon material is etched using such reagents which have not been subjected to further purification, the sample itself provided for analysis is contaminated.

FIG. 1 is a schematic diagram of an apparatus used upon the etching of a silicon material by dissolving acid vapor in water in which the silicon material has been dipped. This apparatus has a closed top container 1 and in this closed top container 1, installed are a sample container 3 which contains therein pure water W and a silicon material sample M, a hydrofluoric acid container 5A which contains therein hydrofluoric acid A and a nitric acid container 5B which contains therein nitric acid B.

By heating the above-described hydrofluoric acid and nitric acid by means of heaters 7A and 7B, the closed top container is filled with highly-pure acid vapor composed of a hydrofluoric acid gas and a nitric acid gas until the container is saturated with the acid vapor. These gases are dissolved in pure water, whereby the sample kept in the sample container is dissolved.

It is however necessary to heat for 2 to 3 hours to saturate the closed top container with the acid vapor and then to dissolve the hydrofluoric acid and nitric acid in pure water. If the time necessary for dissolving the sample in the resulting solution is taken into consideration, 10–12 hours in total are necessary to dissolve 1 g of the silicon material. Thus, the above method requires long hours for dissolving the silicon material sample and is therefore not efficient.

In addition, if it takes much time to dissolve the silicon material sample, an amount of the contamination from surroundings shows an increase, which makes it impossible to carry out analysis with high sensitivity.

SUMMARY OF THE INVENTION

With these problems in mind, therefore, it is the primary object of the present invention to provide an etching method and an etching apparatus for a silicon material, in which contamination from reagents or surroundings is prevented, and which is capable of carrying out the rapid etching of the silicon material crystals for semiconductor and thereby preparing a sample for the analysis of impurities through frameless atomic absorption analysis or inductively coupled plasma (ICP) mass analysis.

The method for etching a silicon material according to the present invention comprises the steps of: etching the silicon material by contacting the silicon material with an etching gas containing a fluorine compound which is selected from the group consisting of xenon fluoride, hydrogen fluoride, oxygen fluoride and halogen fluoride, to produce a product by reaction of the silicon material with the etching gas; and heating the product to evaporate and remove the product from an impurity which is contained in the silicon material and not reactive to the etching gas.

Moreover, the method for etching a silicon material according to the present invention comprises the step of: etching the silicon material by contacting the silicon material with an etching gas containing a fluorine compound which is selected from the group consisting of xenon fluoride, oxygen fluoride and halogen fluoride, to produce a product by reaction of the silicon material with the etching gas.

The apparatus for etching a silicon material according to the present invention comprises: a vessel for receiving the silicon material thereon; a container for enclosing the vessel therein, in which the vessel is removably placed; a gas generator for generating an etching gas to supply the etching gas to the silicon material in the container, the etching gas containing a fluorine compound which is selected from the group consisting of xenon fluoride, hydrogen fluoride, oxygen fluoride and halogen fluoride; and a heater for heating the silicon material.

The features and advantages of the etching apparatus for a silicon material according to the present invention over the proposed conventional apparatus will be more clearly understood from the following description of the preferred embodiments of the present invention taken in conjunction with the accompanying drawings.

BRIEF DESCRIPTION OF THE DRAWINGS

In the accompanying drawings, like reference numerals designate the same or similar elements or sections throughout the figures thereof.

DETAILED DESCRIPTION OF THE PREFERRED EMBODIMENTS

Figure 1:
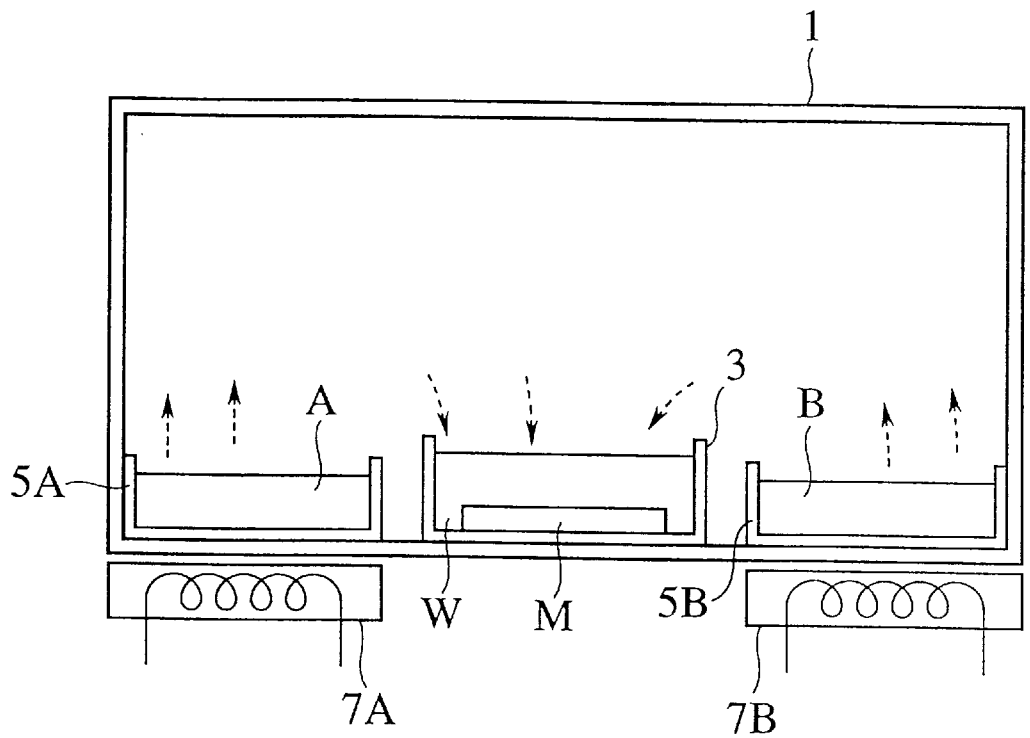
FIG. 1 is a schematic view of a conventional etching apparatus for a silicon material.

The silicon material etched by the etching method according to the present invention is composed mainly of silicon (Si) or silicon oxide ($SiO_2$) including quartz glass, and impurities contained in the silicon material remains after the etching Si or $SiO_2$. Accordingly, the impurities which remain after the etching of the silicon material by the etching method according to the present invention are collected and analyzed by frameless atomic absorption analysis or inductively coupled plasma (ICP) mass analysis, whereby an impurity content of the silicon material is determined.

The above-described silicon material is etched by bringing it in direct contact with an etching gas which contains a fluorine compound selected from the group consisting of xenon fluorides, hydrogen fluorides, oxygen fluorides and halogen fluorides. The direct contact of the silicon material with an etching gas makes it possible to allow etching to proceed in a short time.

Examples of the xenon fluoride usable in the present invention include $XeF_2$, $XeF_4$ and $XeF_6$. Examples of the oxygen fluoride include $OF_2$ and $O_2F_2$. Examples of the halogen fluorides include $ClF_3$, $ClF$, $BrF$, $BrF_3$, $BrF_5$, $IF_5$, $IF_6$ and the like.

When the etching gas containing $XeF_4$, $O_2F_2$ or $ClF_3$ is used for the etching of Si, the reaction as represented by the following formula (1), (2) or (3) occurs.

$$XeF_4 + Si \rightarrow SiF_4 + Xe \quad (1)$$

$$2O_2F_2 + Si \rightarrow SiF_4 + 2O_2 \quad (2)$$

$$2ClF_3 + Si \rightarrow SiF_4 + 2ClF \quad (3)$$

The reaction represented by the above formula (2) or (3) proceeds at normal temperature, while the reaction of the formula (1) proceeds at a temperature higher than that of the reaction of the formula (2) or (3). It is therefore preferred to adjust the etching conditions as needed. In the case of the reaction of the formula (1), it is preferred to heat a $XeF_4$-containing etching gas to a temperature of 100 to 150° C. and bring it into contact with the silicon material.

When $SiO_2$ is etched using an etching gas containing $XeF_4$, $O_2F_2$ or $ClF_3$, the reaction proceeds as shown in the following formula (1'), (2') or (3').

$$XeF_4 + SiO_2 \rightarrow SiF_4 + XeO_2 \quad (1')$$

$$2O_2F_2 + SiO_2 \rightarrow SiF_4 + 3O_2 \quad (2')$$

$$2ClF_3 + SiO_2 \rightarrow SiF_4 + 2ClF + O_2 \quad (3')$$

When the fluorine compound contained in the etching gas is $OF_2$, $O_2F_2$ and $O_3F_2$, the etching of Si proceeds through two-stage reaction as shown in the following formulas (4) and (5).

$$2OF_2 + Si \rightarrow SiO_2 + 2F_2 \quad (4)$$

$$SiO_2 + 2F_2 \rightarrow SiF_4 + O_2 \quad (5)$$

In the case where the silicon material is $SiO_2$, the reaction of (5) proceeds.

If the fluorine compound contained in the etching gas is $XeF_2$, $XeF_4$ and $XeF_6$, etching proceeds through the reactions as shown in the following formulas (6) and (7) in the presence of an organic compound having a proton donating property. In this case, the silicon material to be reacted is $SiO_2$ so that a fluorine compound which allows the reaction of the above-described formulas (1)–(5) to proceed or an oxidizing gas such as a nitric acid gas is used in combination for the etching of Si.

$$XeF_2 + 2H^+ \rightarrow Xe^{2+} + 2HF \quad (6)$$

$$4HF + SiO_2 \rightarrow SiF_4 + 2H_2O \quad (7)$$

In particular, the reaction of the formula (6) proceeds rapidly at a temperature not lower than about 80° C. so that it is preferred to carry out etching at a temperature of 80 to 130° C.

As the organic compound having a proton donating property, a polar organic solvent such as alcohol or ketone compound can be used after vaporization. A polar solvent having a boiling point not higher than about 100° C. such as acetonitrile, acetone, ethanol or methanol is preferred from the viewpoint of vaporizability. When $XeF_2$ or the like is dissolved in such a polar organic solvent and the solvent is then vaporized by heating or the like, vaporization in the form of Xe together with solvent molecules occurs.

It can be easily understood from the above formula (7) that Si can be etched using an etching gas containing hydrogen fluoride and a fluorine compound which allows the reaction of either of the above-described formulas (1) to (5) to proceed.

In the reaction shown by any one of the formulas (1) to (7) and (1') to (3'), $SiF_4$ is finally formed. $SiF_4$ vaporizes at a temperature of about 80 to 100° C. or higher so that when etching is conducted at a temperature of 80 to 100° C. or so, it is possible to rapidly vaporize $SiF_4$ without vaporizing impurities contained in the silicon material. This makes it easy to separate $SiF_4$ from remaining impurities after etching. In addition, since other products formed by the reactions of the above formulas (1) to (7) and (1') to (3') take the gaseous form, only metal impurities contained in the silicon material remain in the solid form after etching.

In the present invention, by etching the silicon material while heating it by an etching gas containing the above-described fluorine compound, the reaction product is vaporized and distilled off and only the metal impurities contained in the silicon material are collected as a solid residue.

According to the above-described etching method, an impurity concentration as low as $10^{-2}$ to $10^{-3}$ ppb can be measured and etching time can be reduced to 1/25 to 1/50 of that of the conventional method. Furthermore, contamination of the sample from surroundings can be suppressed to the minimum.

As described above, it becomes possible to measure the impurity content of the silicon material by reacting a fluorine compound with Si or $SiO_2$ and analyzing the remaining impurities by an existing analytical instrument. Examples of the analytical instrument ordinarily employed include frameless atomic absorption photometer and inductively coupled plasma mass spectrometer.

The analysis of impurities by such an analytical instrument requires a sample having impurities dissolved in the ionic form in a solvent. Therefore, after the remaining impurities are dissolved in, for example, hydrochloric acid, nitric acid or sulfuric acid, the resulting solution is collected and analyzed by the analytical instrument.

One example of an apparatus embodying the etching method of the present invention will be now explained with reference to the accompanying drawings.

Figure 2:
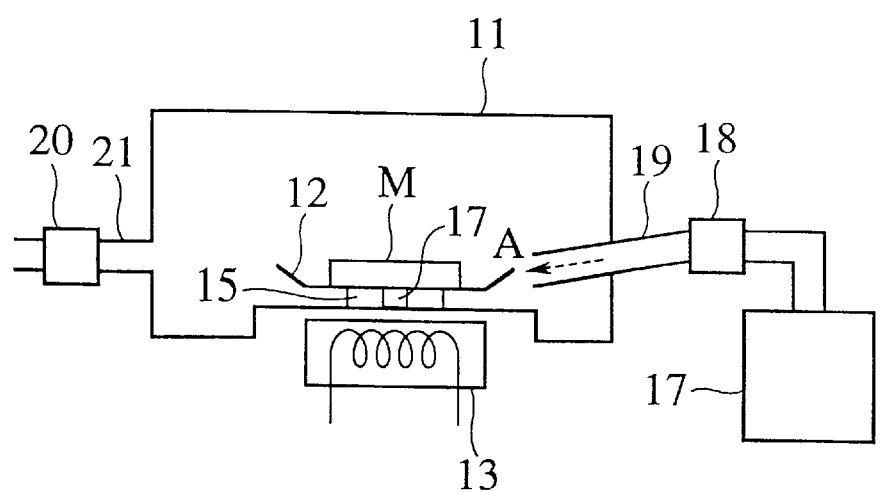
FIG. 2 is a schematic view of an etching apparatus for a silicon material according to the first embodiment of the present invention.

FIG. 2 is a schematic view of an etching apparatus for a silicon material according to the present invention.

A closed top container 11 is connected with an etching gas forming apparatus 17 through an inlet tube 19 equipped with an inlet valve 18. By controlling the valve 18, the amount of the etching gas introduced into the closed top container is limited. Also equipped is an exhaust channel 21 having an exhaust valve 20 connected with an exhaust apparatus (not illustrated).

In the closed top container 11, a sample tray 12 in the form of a boat on which a silicon material M can be placed and which can be turned around is disposed. In addition, a heating apparatus 13 is equipped outside the closed top container 11 so as to heat the sample tray 12.

It is necessary to manufacture the etching apparatus of the present invention from a material which has corrosion resistance against an etching gas used in the present invention, for example, a gas containing hydrogen fluoride or the like, and at the same time has heat resistance. As a material having such properties, polytetrafluoroethylene or the like can be used. No particular limitation is imposed on the volume of the closed top container, but a container having a volume of 3000 to 5000 cc can be used ordinarily.

No particular limitation is imposed on the introduction rate of the fluorine compound gas. Higher introduction rate can make the etching time shorter. However, when the introduction rate is high, care should be taken so as not to scatter the impurities remaining on the sample tray outside the sample tray after etching. The introduction rate of the etching gas is generally about 0.1 to 2 ml/sec.

The above-described heating apparatus serves to vaporize $SiF_4$ and the product obtained by the etching reaction, thereby separating $SiF_4$ from unreacted impurities. Accordingly, it is only necessary to use a heater such as electric resistance heater which can heat the silicon material sample or sample tray to about 80 to 130° C. The heating means can be installed inside of the closed top container, but it is desired to dispose it outside the closed top container 11 as illustrated in the drawing and also to install a member 15 which transfers heat to the sample tray. The reason why the heating apparatus is installed outside the etching apparatus is to prevent the heating apparatus from becoming a contamination source.

There is no particular limitation imposed on the etching gas forming apparatus insofar as it can introduce a fluorine-compound-containing etching gas of the present invention into the closed top container 11. For example, a xenon fluoride is dissolved in a bromine fluoride or acetonitrile and then, the xenon fluoride and acetonitrile are vaporized by heating the resulting solution at 100 to 120° C., followed by introduction into the closed top container. The xenon fluoride reacts with acetonitrile, depending on the heating temperature of the solution, and the reaction product is introduced into the closed top container with Xe and HF being partially contained. According to the reaction of the above-described formulas (1), (6) and (7), a Si substrate is etched by the xenon fluoride. As described above, Xe or HF does not involve any problem because the silicon material sample is finally etched, reacting with Xe or Xe and HF.

Hydrogen fluoride can be introduced rapidly by heating hydrofluoric acid to 50° C. or higher.

When an oxygen fluoride is introduced, it is only necessary to introduce, into the closed top container, oxygen difluoride obtained by allowing a fluorine gas to pass through an aqueous solution of sodium hydroxide.

A fluorine halide, for example a fluorine chloride gas, may be introduced at a rate of 0.3 ml/min at normal temperature.

For uniform and fast etching of the silicon material by bringing a fluorine compound gas into direct contact with the silicon material sample as described above, a rotor 17 which turns the sample tray on which the silicon material has been placed is effective. This is because by turning the silicon material, temperature boundary layer under the diffusion controlled region becomes narrow. The rotation at a rate of 0.1 to 100 rpm is preferred.

As can be understood from the above formula (7), hydrogen fluoride etches $SiO_2$ but not etches Si. For the etching of Si using hydrogen fluoride, a fluorine compound which allows the reaction of any one of the above-described formulas (1) to (5) to proceed or an oxidizing gas such as nitric acid gas is used in combination. When nitric acid gas and hydrogen fluoride are used, the reaction proceeds as described below by the following formulas (8) to (10):

$$3Si+4HNO_3+18HF \rightarrow 3H_2SiF_6+4NO+8H_2O \quad (8)$$

$$6HF+SiO_2 \rightarrow H_2SiF_6+2H_2O \quad (9)$$

$$H_2SiF_6+SiF_4+2HF \quad (10)$$

Figures 3A, 3B:
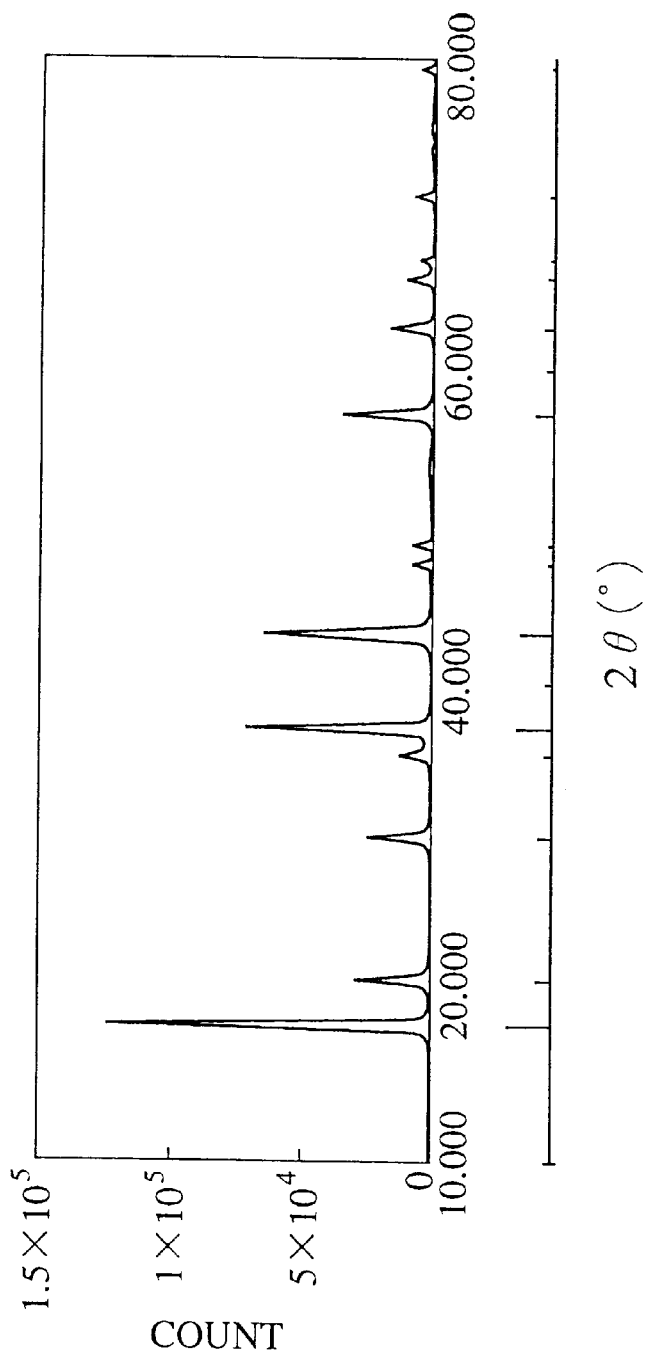
FIGS. 3A and 3B are an X-ray diffraction pattern of the precipitate (a) formed at the time of etching and standard $(NH_4)_2 SiF_6$ (b)

However, it was found by the present inventors that there appeared a white precipitate at the time of etching. As a result of the analysis of the precipitate by X-ray diffraction pattern, the peak position of the analysis data (a) of the precipitate coincided with the peak position of the standard data (b) of ammonium silicofluoride $(NH_4)_2SiF_6$ as illustrated in FIG. 3. It is presumed that as shown by the following formulas (11) and (12), an ammonium ion produced by the reduction of a nitric acid ion forms a salt with hydrofluoric acid.

$$NO_3^-+10H^++8e^- \rightarrow NH_4^++3H_2O \quad (11)$$

$$2HN_4^++H_2SiF_6 \rightarrow (NH_4)_2SiF_6+2H^+ \quad (12)$$

Compared with $H_2SiF_6$ which can be removed by vaporization under heat, ammonium silicofluoride cannot be easily vaporized by heating and has a very strong complex forming capacity. Accordingly, upon etching using an etching gas, the ammonium silicofluoride precipitate covers the surface of the silicon material, thereby preventing the progress of etching. Upon etching using water, ammonium silicofluoride binds with metal impurities in the silicon material and remains together with the metal impurities. Even in the case of the etching without water, there is a possibility that ammonium silicofluoride binds with metal impurities owing to the water content formed by the etching reaction.

In practice, according to the analysis of ammonium silicofluoride recovered in the form of a white precipitate, the white precipitate contains a small amount of metal impurities. Since the ammonium silicofluoride appearing on the silicon material is formed of a hydrogen fluoride gas and a nitric acid gas, contamination from the surroundings is presumed to be very little. A trace amount of metal impurities contained in the white precipitate can be therefore regarded as impurities derived from the silicon material. In consideration of this finding, it is necessary to remove ammonium silicofluoride from the surface of the silicon material in order to heighten the precision of the measurement of the impurity content.

Moreover, when the content of the metal impurity contained in the prepared sample solution is measured by ICPMS method, if the amount of ammonium silicofluoride in the sample solution is high, sensitivity for the metal impurity extremely deteriorates. Therefore, it should be avoided that the sample solution for measurement of the metal impurity contains ammonium silicofluoride.

As a result of studying a method for the removal of ammonium silicofluoride, it has been found that the use of a certain strong oxidizing agent makes it possible to control the generation of ammonium silicofluoride. Examples of the oxidizing agent effective for suppressing the generation of ammonium silicofluoride include aqueous bromine, aqueous chlorine, aqua regia and 98% nitric acid (fuming nitric acid). An oxidizing agent gas (i.e. bromine, chlorine, nitrosyl chloride, nitric acid, etc.) emitted from the above oxidizing agent is supplied together with a hydrogen fluoride gas to the silicon material as an etching gas. Oxidizing agents other than the above-exemplified ones can also be used if they have similar oxidative ability. For example, it is possible to introduce, into the etching gas, an $NO_2$ gas which is generated by adding a metal element to a system of nitric acid and hydrofluoric acid or by using an organic solvent and sulfuric acid to cause dehydration and decomposition of nitric acid.

It is not clear how such a strong oxidizing agent acts on the generation of ammonium silicofluoride, but it is presumed that the oxidizing agent prevents the generation of an ammonium ion; it oxidizes the resulting ammonium ion again, thereby suppressing the generation of ammonium silicofluoride; or it accelerates the separation into $H_2SiF_6$ and $NH_4OH$.

As described above, by preventing the generation and remaining of ammonium silicofluoride, etching of the surface of the silicon material can be allowed to proceed uniformly. In the case of partial etching, the surface made on the silicon material by subjecting to partial etching is smooth. This method can therefore be applied to not only the etching of the whole silicon material but also the etching of the surface portion or fixed portion of the material, and control of the etching can be carried out with accuracy.

Figure 4:
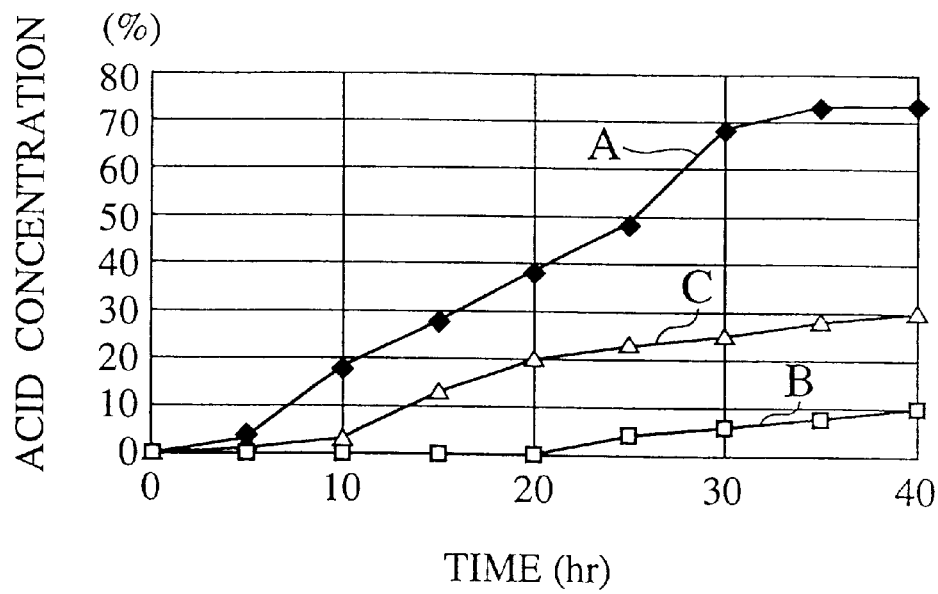
FIG. 4 is a graph illustrating the time-dependent change of the concentration of the acid absorbed in water.

FIG. 4 is a graphic illustration showing the time-dependent change, at the time when the acid in the gaseous form is brought into contact with water, of the concentration of the acid absorbed in water. The line A illustrates the case where an acid in the gaseous form is generated from 98% nitric acid, the line B illustrates the case where the acid is generated from 58% nitric acid and the line C illustrates the case where the acid is generated from 50% hydrofluoric acid. It can be understood from these drawings that the absorption amount of the acid in the case of 58% nitric acid is lower than that of the acid in the case of 50% hydrofluoric acid. So, when a silicon material is etched by immersing it in water in which gases generated from 58% nitric acid and 50% hydrofluoric acid have been dissolved, the amount of nitric acid is insufficient compared with the amount of hydrogen fluoride in water, which lowers the oxidizing rate of silicon and retards the rate of the whole etching reaction. When 98% nitric acid is utilized, silicon is oxidized at a high rate and etching proceeds favorably.

It can be understood from FIG. 4 that, for the etching using water, 98% nitric acid is better than 58% nitric acid. If 58% nitric acid is used, it is possible to improve the etching rate by adjusting the using ratio of 58% nitric acid and hydrofluoric acid so that the acid concentration in water will be appropriate. In this case, it is preferred to adjust the acid concentration in water to $HNO_3$:HF=2 to 3:1.

Even if the etching gas is brought into direct contact with a silicon material, water is generated by the reaction of hydrogen fluoride as shown in the formula (10). The remaining of water on the surface of the silicon material brings about the condition similar to the above. Accordingly, it becomes important 1) to adjust the mixing ratio of the etching gas as described above and 2) to vaporize off the water from the silicon material. Concerning 2), heating the etching temperature to 80 to 100° C. to vaporize water and the reaction product caused by etching reaction is an effective means.

According to the present invention, the silicon material can be etched within a time as short as the ⅒ of the time required for the conventional method; the silicon material is contaminated little by surroundings during etching; and the impurity content of the silicon material can be determined accurately by using the impurities recovered. In addition, the etching reaction proceeds uniformly on the surface of the silicon material.

Figure 5:
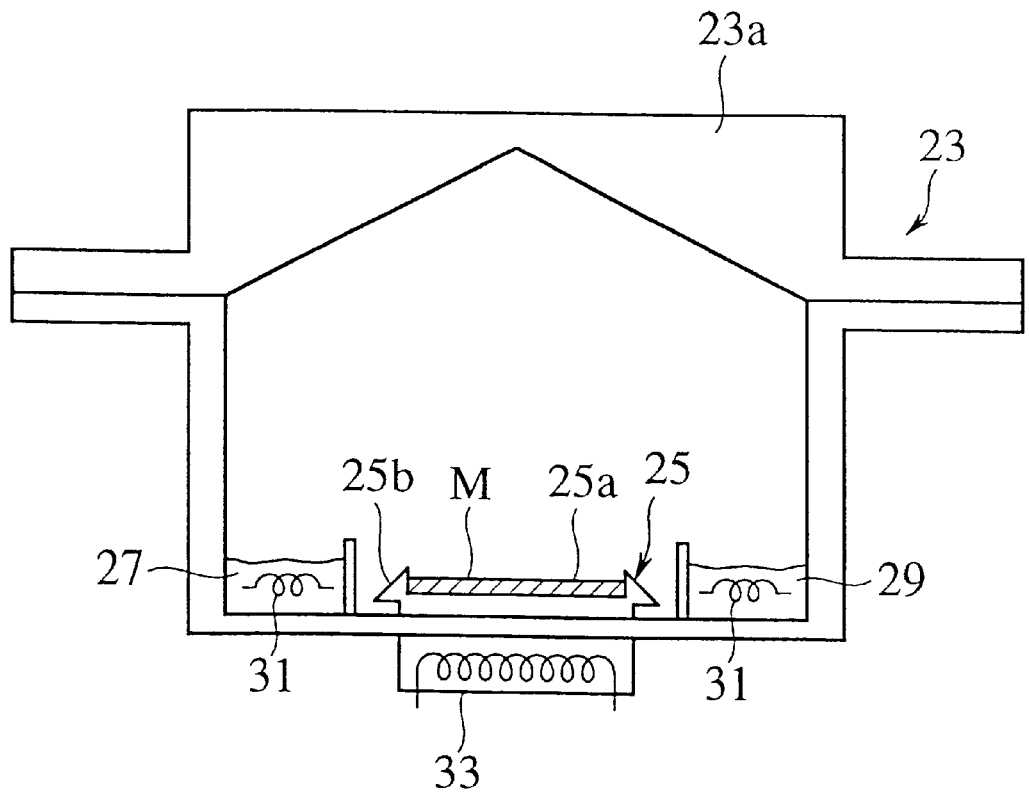
FIG. 5 is a schematic view of a silicon material etching apparatus according to the second embodiment of the present invention.

The etching method according to the present invention can also be carried out using a simple apparatus as illustrated in FIG. 5.

In FIG. 5, a closed top container 23 is formed of a lid 23a and a bottom portion 23b and installed at the center is a container 25 for receiving a Si semiconductor substrate M. The container 25 is equipped with a concave portion 25a for disposing the substrate M thereon. The substrate M is held on the container 25 by a circular elastic presser 25b equipped around the concave portion 25a. A container 27 is filled with hydrogen fluoride, while a container 29 is filled with $HNO_3$.

The closed top container 23 has also a heating means 31. After the sample is placed, the heating means 31 is activated, whereby HF and $HNO_3$ are vaporized from the containers 27 and 29, respectively and absorbed in the Si substrate on the container 25. In this way, the etching is conducted rapidly. The heating means 31 is preferably disposed outside the container 23 from the viewpoint of the prevention of contamination. In addition, another heating means 33 is disposed to heat the container 25.

In the above apparatus, it is preferred that the etching gas in the container 25 which gas is brought into contact with the substrate M contains $HNO_3$ and HF at a rate of 2 to 3:1. The impurities contained in HF and $HNO_3$ in the containers 27 and 29 do not vaporize because of vapor pressure so that the acid vapor so obtained has a markedly high purity.

EXAMPLES

The present invention will now be described in detail by way of Examples and Comparative Examples.

An apparatus, as illustrated in FIG. 2, having closed top container 11, sample tray 12, inlet tube 19 and polytetrafluoroethylene-coated inside wall was used in Examples 1–4 which will be described hereinafter.

Example 1

On the sample tray 12 of the etching apparatus illustrated in FIG. 2, a phosphorus-doped silicon wafer having a specific resistance of 1.2 $\Omega$cm, a thickness of 625 $\mu$m and a weight of 10 g was disposed and the heating apparatus 13 was activated to heat the wafer to 90° C.

In the etching gas forming apparatus 17, a solution in which 10 g of xenon fluoride ($XeF_2$) had been dissolved in 100 ml of acetonitrile was heated to 130° C. The resulting gas was introduced to the closed top container 11, whereby the wafer was etched.

Two hours after the gas was introduced from the etching gas forming apparatus 17, etching of the wafer was completed and a trace amount of the residue was observed on the sample tray 12.

Then, the gas was exhausted from the closed top container by an exhaust gas apparatus. In the sample tray 12, 0.1M diluted sulfuric acid was poured to dissolve the residue on the sample tray 12 therein, whereby a sample solution was prepared.

The sample solution thus obtained was analyzed using the inductively coupled plasma mass spectrometer under the following conditions.

Drying: 30 seconds at 120° C.

Ashing: 20 seconds at 400° C., 10 seconds at 1,000° C.

Carrier gas and its rate: argon, 300 ml/min (no carrier gas at the time of atomization)

As a result of the analysis, it was found that the impurities content of the wafer was 0.01 ppb for Fe, 0.01 ppb for Cr, 0.001 ppb for Ni and 0.003 ppb for Cu.

Example 2

Using the etching gas forming apparatus 17, the operation of Example 1 was repeated, except that, instead of using a solution of the xenon fluoride, a fluorine gas was introduced into a 11.10 wt % aqueous solution of sodium hydroxide at a flow rate of 0.3 ml/sec to generate an oxygen fluoride and the resulting gas was introduced into the closed top container 11, and etching of the wafer and analysis of impurities were carried out.

As a result of the analysis, it was found that the impurities content of the wafer was 0.01 ppb for Fe, 0.01 ppb for Cr, 0.001 ppb for Ni and 0.003 ppb for Cu.

Comparative Example 1

In the sample container 3 of FIG. 1, 50 ml of pure water were poured. The wafer similar to that used in Example 1 was dipped in the water and disposed in the closed top container 1. In the containers 5A and 5B, 20 ml of 50% hydrofluoric acid and 100 ml of 60% nitric acid were poured, respectively, followed by heating to 210° C.

Etching of the wafer was completed 50 hours after the heating was started. The solution in the sample container 3 was analyzed using an inductively coupled plasma mass spectrometer under the conditions similar to those in Example 1.

As a result of the analysis, it was found the impurity content of the wafer was 0.001 ppb for Ni. Amounts of Fe, Cr and Cu detected were extraordinary large, which suggests that the contamination of the sample occurs during the long-time etching.

Example 3

The operation of Example 1 was repeated, except that a boron-doped silicon wafer having a specific resistance of 2.3 $\Omega$cm, a thickness of 625 $\mu$m and a weight of 10 g was used instead of the phosphorus-doped silicon wafer, and that the sample tray 12 was turned at 0.5 rpm during etching, while the wafer was etched. One hour after the gas was introduced from the etching gas forming apparatus 17, the etching of the wafer was completed. The etching operation was then stopped and analysis of impurities was conducted in a similar manner to Example 1.

As a result of the analysis, it was found that the impurity content of the wafer was 0.02 ppb for Fe, 0.01 ppb for Cr, 0.001 ppb for Ni and 0.005 ppb for Cu.

Example 4

The operation of Example 3 was repeated, except that, instead of supplying the xenon fluoride from the etching gas forming apparatus 17, a $ClF_3$ gas was introduced to the closed top container 11 at a flow rate of 10 ml/min, and that the rotational speed of the sample tray 12 was changed to 1 rpm, and the wafer was etched. The etching of the wafer was completed 40 minutes after the introduction of the $ClF_3$ gas was started. The etching operation was then stopped and analysis of the impurities was conducted in a similar manner to Example 1.

As a result of the analysis, it was found that the impurity content of the wafer was 0.02 ppb for Fe, 0.01 ppb for Cr. 0.001 ppb for Ni and 0.005 ppb for Cu.

Example 5

On the container 25 installed in the closed-top container 23 which is illustrated in FIG. 5 and has an internal volume of about 5,000 cm$^3$, a phosphorus-doped silicon wafer having a specific resistance of 1.5 $\Omega$cm, a thickness of 625 $\mu$m and a weight of 10 g was placed. In the container 27, 200 ml of 50% hydrofluoric acid were charged, while in the container 29, 200 ml of 98% nitric acid (fuming nitric acid) were charged. The hydrofluoric acid and nitric acid were heated at 120° C. for 30 minutes, whereby a trace amount of a white precipitate [$(NH_4)_2SiF_6$] was recognized in the container 27 but the wafer was completely etched.

In the container 25, 0.2 ml of pure water was poured to prepare a sample solution. The impurities of the resulting sample solution were analyzed using an atomic absorption photometer ("5100ZL", trade name; manufactured by Perkin-Elmer Corporation) and an ICPMS equipment ("SPQ6500", trade name; manufactured by Seiko Corporation) under the following conditions:

(atomic absorptiometry)

drying: at 120° C. for 30 seconds, ashing: at 400° C. for 4 seconds (analysis of Na), at 700° C. for 4 seconds (analysis of K), carrier gas and its rate: argon at 0.3 ml/min (no carrier at the time of atomization), wavelength measured: 589.0 nm (analysis of Na), 766.5 nm (analysis of K)

(ICPMS method)

drying: at 120° C. for 40 seconds, ashing: at 400° C. for 30 seconds, 600° C. for 40 seconds, atomization: 5 seconds at 2,500° C., carrier gas and its rate: argon, 1.2 ml/min., mass measured: $^{56}Fe$, $^{63}Cu$, $^{59}Ni$, $^{52}Cr$.

As a result of the analysis, it was found that the impurity content of the wafer was 0.005 ppt for Na, 0.003 ppt for K, 0.08 ppt for Fe and 0.005 ppt for Cr.

Comparative Example 2

The operation of Example 5 was repeated, except that 200 ml of 60% nitric acid were charged in the container 29 instead of 200 ml of 98% nitric acid (fuming nitric acid), and that heating time of hydrofluoric acid and nitric acid was changed to 2 hours, whereby wafer was etched. The wafer remains on the container 27 and a large amount of white precipitates [$(NH_4)_2SiF_6$] was formed on the surface of the wafer. It was therefore impossible to analyze the impurities.

Examples 6a to 6d

In each example, the operation of Example 5 was repeated, except that a wafer as shown in Table 1 was used instead of the wafer used in Example 5, that an etching time was limited to effect the etching only 10 μm deep from the surface layer of the wafer, and that 20 ml of deionized water were used to prepare a sample solution, etching was carried out. The impurities were analyzed also in a similar manner. Results of the analysis are shown in Table 1.

TABLE 1

| Ex. | Wafer | Impurity concentration (ppt) | | | |
|---|---|---|---|---|---|
| | | Fe | Cu | Cr | Ni |
| 6a | Czochralski (doped with boron, 4.5 Ωcm) | <1 | <1 | <1 | <1 |
| 6b | Czochralski (doped with phosphorus, 1 μcm) | <1 | <1 | <1 | <1 |
| 6c | HAI*⁾ (doped with phosphorus, 1 μcm) | 300 | 70 | 30 | 40 |
| 6d | Epi**⁾ (doped with boron, 4.5 μcm) | 450 | 55 | 130 | 240 |

*⁾Hydrogen Annealed Wafer
**⁾Exitaxcial Wafer

From the results of Example 6c and Example 6d, it has been found that the surface layers of HAI wafer and Epi wafer contain a large amount of metal impurities, respectively.

Comparative Examples 3a to 3d

In each of Comparative Examples 3a to 3d, the operation of each of Examples 6a to 6d was repeated, correspondingly, except that nothing was charged in the containers 27 and 29; and 8 ml of highly-pure nitric acid and 4 ml of highly-pure hydrofluoric acid were charged in the container 25 to bring the wafer in direct contact with the resulting acid solution, whereby etching and analysis of impurities were conducted. The results are shown in Table 2.

TABLE 2

| Com. Ex. | Wafer | Impurity concentration (ppt) | | | |
|---|---|---|---|---|---|
| | | Fe | Cu | Cr | Ni |
| 3a | Czochralski (doped with boron, 4.5 Ωcm) | 40 | 15 | 20 | 10 |

TABLE 2-continued

| Com. Ex. | Wafer | Impurity concentration (ppt) | | | |
|---|---|---|---|---|---|
| | | Fe | Cu | Cr | Ni |
| 3b | Czochralski (doped with phosphorus, 1 μcm) | 40 | 15 | 20 | 10 |
| 3c | HAI (doped with phosphorus, 1 μcm) | 300 | 70 | 30 | 40 |
| 3d | Epi (doped with boron, 4.5 μcm) | 450 | 55 | 130 | 240 |
| Contamination with reagents | | 40 | 15 | 20 | 10 |

Figure 6A:
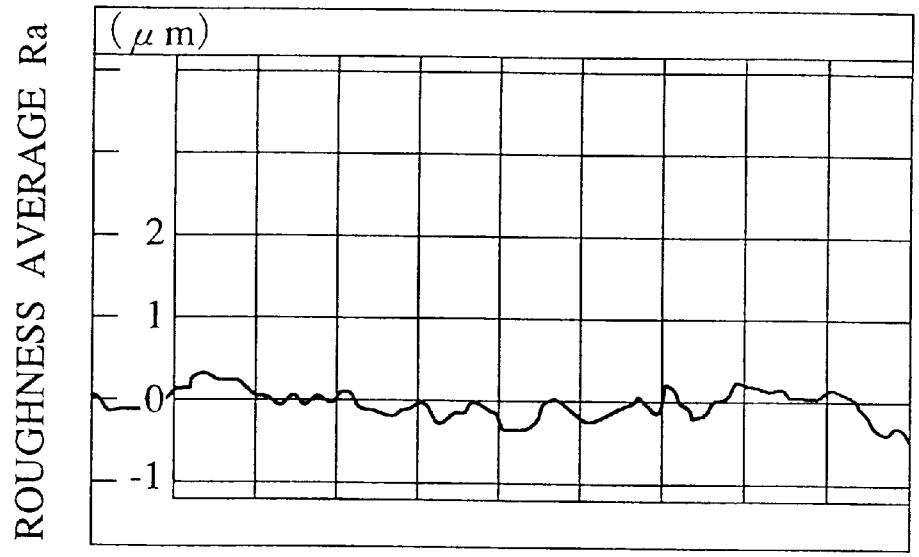
FIG. 6A is a chart illustrating the surface condition of the wafer etched by the etching method according to the present invention.
Figure 6B:
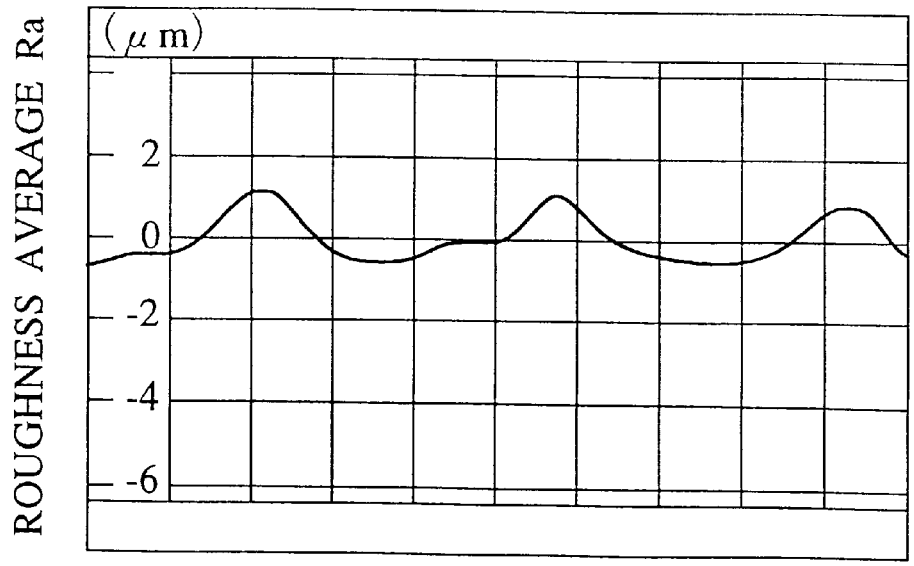
FIG. 6B is a chart illustrating the surface condition of the wafer etched by the conventional method.

FIG. 6A and FIG. 6B show the results of measuring the surface roughness of the wafers, which had been etched in Example 6a and Comparative Example 3a, respectively by a surface roughness tester (Tarisa Leaf). The charts of FIG. 6A and FIG. 6B are formed with a feed of ×44, and a vertical size of ×10,000 (FIG. 6A) and ×5,000 (FIG. 6B), respectively. According to these charts, the wafer of Example 6a has $R_{max}$ of 1.1 μm, while that of Comparative Example 3a has $R_{max}$ of 4 μm, about four times longer than the former one. In short, it has been found that the surface of the wafer obtained in Example 6a has been etched more uniformly.

Examples 7a to 7d, Comparative Example 4

In each example, 10 g of a Czochralski wafer of Example 7a were placed on the container 25 of the closed-top container 23 which was illustrated in FIG. 5 and had an internal volume of about 5,000 cm³. The chemical solutions as shown in Table 3 were charged in the container 27 and 29, respectively. Those chemical solutions in the containers 27 and 29 were heated at 120° C. for the time as shown in Table 3, respectively.

In the container 25, 0.2 ml of pure water was then poured to prepare a sample solution and impurity concentration of the resulting sample solution was analyzed under the analysis conditions similar to those of Example 5. Results are shown in Table 3.

TABLE 3

| | Container 27 | Container 29 | Etching Time (min) | Impurity Concentration (ppt) | | | |
|---|---|---|---|---|---|---|---|
| | | | | Fe | Cu | Cr | Ni |
| Ex. 7a | No₂ gas | hydrofluoric acid | 60 | 8 | 5 | 5 | 7 |
| Ex. 7b | nitrosyl fluoride | hydrofluoric acid | 60 | 10 | 6 | 3 | 9 |
| Ex. 7c | fuming nitric acid | hydrochloric acid | 120 | 4 | 8 | 5 | 3 |
| Ex. 7d | 68% nitric acid + Si | hydrofluoric acid | 300 | 8 | 10 | 3 | 6 |
| Comp. Ex. 4 | 68% nitric acid | hydrofluoric acid | 720 | <50 | <50 | <30 | <30 |

As can be understood from the above-described results, the etching method according to the present invention makes it possible to reduce the etching time to ½ to 1/10 of the time required for the conventional method.

It must be understood that the invention is in no way limited to the above embodiments and that many changes may be brought about therein without departing from the scope of the invention as defined by the appended claims.

What is claimed is:

1. A method for etching a silicon material, comprising:
   etching the silicon material by contacting the silicon material with an etching gas containing a fluorine compound which is selected from the group consisting of $XeF_4$, $XeF_6$, $OF_2$, $O_2F_2$, and $IF_6$, to produce a product by reaction of the silicon material with the etching gas.

2. The etching method of claim 1, wherein the product includes tetrafluorosilcion.

3. The etching method of claim 1, further comprising the step of:

heating the product to evaporate and remove the product from an impurity which is contained in the silicon material and not reactive to the etching gas.

4. The etching method of claim 1, wherein the silicon material includes silicon or silicon oxide.

5. The etching method of claim 1, wherein, at the heating step, the product is heated at a temperature which is equal to 80° C. or higher than 80° C.

6. The etching method of claim 3, wherein the fluorine compound is xenon fluoride, and the product, of the heating, is heated at a temperature within a range of 100 to 150° C.

7. The etching method of claim 1, wherein the etching gas further contains an oxidizing agent for suppressing production of ammonium silicofluoride, and the oxidizing agent is selected from the group consisting of bromine, nitrosyl chloride, nitric acid and nitrogen dioxide.

8. An apparatus for preparing a sample for measuring an impurity of a silicon material, comprising:

a vessel for receiving the silicon material thereon;

a container for enclosing the vessel therein, in which the vessel is removably placed;

a gas generator for generating an etching gas to supply the etching gas to the silicon material in the container to form a reaction product, the etching gas containing a fluorine compound which is selected from the group consisting of $XeF_4$, $XeF_6$, $OF_2$, $O_2F_2$, and $IF_6$; and a heater for heating and evaporating the reaction product to remove the reaction product from the impurity of the silicon material.

9. The apparatus of claim 8, further comprising:

a rotator for rotating the vessel relative to the etching gas being supplied so that supply of the etching gas is made uniform to the silicon material.

10. The apparatus of claim 8, further comprising:

a gas exhaust for removing the etching gas and the reaction product from the container.

11. A method for measuring an impurity which is contained in a silicon material, comprising the steps of:

etching the silicon material by contacting the silicon material with an etching gas containing a fluorine compound which is selected from the group consisting of xenon fluoride, hydrogen fluoride, oxygen fluoride and halogen fluoride, to produce a product by reaction of the silicon material with the etching gas, wherein the etching gas further contains an oxidizing agent for suppressing production of anmnonium silicofluoride, and the oxidizing agent is selected from the group consisting of bromine, nitrosyl chloride, nitric acid and nitrogen dioxide;

heating the product produced during the etching to evaporate and remove the product from the impurity which is contained in the silicon material; and preparing a sample containing the separated impurity, and subjecting the sample to measurement of the impurity.

* * * * *